US012532782B2

(12) United States Patent
Lim et al.

(10) Patent No.: US 12,532,782 B2
(45) Date of Patent: Jan. 20, 2026

(54) FLASH LED PACKAGE WITH OPTICAL SENSORS

(71) Applicant: SAMSUNG ELECTRONICS CO., LTD., Suwon-si (KR)

(72) Inventors: Dongsoo Lim, Seoul (KR); Chinwoo Kim, Incheon (KR); Jeongje Moon, Seoul (KR); Jaeyoo Jeong, Hwaseong-si (KR); Jun Cho, Yongin-si (KR); Yongchul Kang, Hwaseong-si (KR); Jongwook Ju, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 656 days.

(21) Appl. No.: 17/948,298

(22) Filed: Sep. 20, 2022

(65) Prior Publication Data
US 2023/0197701 A1 Jun. 22, 2023

(30) Foreign Application Priority Data

Dec. 21, 2021 (KR) ........................ 10-2021-0184305

(51) Int. Cl.
H01L 25/16 (2023.01)
G03B 15/05 (2021.01)
(Continued)

(52) U.S. Cl.
CPC ............ H01L 25/167 (2013.01); G03B 15/05 (2013.01); G03B 15/06 (2013.01); H01L 25/165 (2013.01);
(Continued)

(58) Field of Classification Search
CPC . H01L 25/167; H01L 25/165; H01L 25/0655; G03B 15/05; G03B 15/06;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 111095286 A * 5/2020 ......... G06V 40/1318
JP 3987769 B2 10/2007
(Continued)

OTHER PUBLICATIONS

TW-202135409-A written translation (Year: 2021).*
RGBC light detection motivation (Year: 2021).*

Primary Examiner — Ratisha Mehta
Assistant Examiner — Thaddeus J Kolb
(74) Attorney, Agent, or Firm — Muir Patent Law, PLLC

(57) ABSTRACT

A flash light emitting diode (LED) package includes a circuit board, a flash LED device disposed on an upper surface of the circuit board n, first and third optical sensors arranged to be adjacent to a first side of the flash LED device on the upper surface of the circuit board and configured to detect light of a first wavelength and light of a second wavelength, respectively, second and fourth optical sensors arranged to be adjacent to a second side of the flash LED device on the upper surface of the circuit board and configured to detect light of the first wavelength and light of the second wavelength, respectively, and an integrated circuit (IC) chip disposed to face a third side between the first and second sides of the flash LED device on the upper surface of the circuit board.

20 Claims, 23 Drawing Sheets

(51) Int. Cl.
  *G03B 15/06* (2021.01)
  *H04M 1/02* (2006.01)
  *H04M 1/22* (2006.01)
  *H04N 23/56* (2023.01)
  *H10F 30/10* (2025.01)
  *H10F 77/00* (2025.01)
  *H10H 20/856* (2025.01)
  *H10H 20/857* (2025.01)

(52) U.S. Cl.
  CPC .......... *H04M 1/0264* (2013.01); *H04M 1/22* (2013.01); *H04N 23/56* (2023.01); *H10F 77/933* (2025.01); *H10H 20/856* (2025.01); *H10H 20/857* (2025.01); *G03B 2215/0567* (2013.01); *G03B 2215/0592* (2013.01); *H04M 2250/52* (2013.01); *H10F 30/10* (2025.01)

(58) Field of Classification Search
  CPC ... G03B 2215/0567; G03B 2215/0592; H04M 1/0264; H04M 1/22; H04M 2250/52; H04N 23/56; H10F 77/933; H10F 30/10; H10F 55/25; H10H 20/856; H10H 20/857; H10H 20/855; H10H 20/8506; G01J 1/00
  See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2007/0115685 A1 | 5/2007 | Kondo et al. | |
| 2012/0290255 A1 | 11/2012 | Kelkar et al. | |
| 2015/0214453 A1* | 7/2015 | Jung | H10H 20/85 257/98 |
| 2017/0122800 A1 | 5/2017 | Costello et al. | |
| 2019/0019837 A1* | 1/2019 | Wong | G01T 1/29 |
| 2020/0161346 A1* | 5/2020 | Chen | H10F 39/018 |
| 2021/0043614 A1* | 2/2021 | Song | H01L 25/167 |

FOREIGN PATENT DOCUMENTS

| | | | | |
|---|---|---|---|---|
| JP | 2020-009905 A | | 1/2020 | |
| KR | 10-2019-0047249 A | | 5/2019 | |
| TW | 1527166 B | * | 3/2016 | ........... H01L 25/167 |
| TW | 202135409 A | * | 9/2021 | ........... H10H 20/855 |

* cited by examiner

FLASH LED PACKAGE WITH OPTICAL SENSORS

CROSS-REFERENCE TO RELATED APPLICATION

This application claims benefit of priority to Korean Patent Application No. 10-2021-0184305, filed on Dec. 21, 2021, in the Korean Intellectual Property Office, the disclosure of which is incorporated herein by reference in its entirety.

BACKGROUND

1. Field

Embodiments relate to a flash light emitting diode (LED) package with optical sensors.

2. Description of the Related Art

In general, a camera module is used together with a flash module as a flash illumination and an optical sensor configured to detect ambient light for camera image correction to capture an image in a dark environment. For example, in a mobile device, e.g., a mobile phone, a light emitting diode (LED) flash module integrated with an optical sensor for a camera function may be used together with a camera module. The optical sensor-integrated LED flash module is required to secure the design freedom required for mobile devices and a stable light receiving function for correcting a color shift of the optical sensor.

SUMMARY

According to an aspect of embodiments, a flash light emitting diode (LED) package with optical sensors may include a circuit board; a flash LED device disposed on an upper surface of the circuit board and having a light emission region; first and third optical sensors arranged to be adjacent to a first side of the flash LED device on the upper surface of the circuit board and configured to detect light of a first wavelength and light of a second wavelength, respectively; second and fourth optical sensors arranged to be adjacent to a second side of the flash LED device positioned opposite to the first side on the upper surface of the circuit board and configured to detect light of the first wavelength and light of the second wavelength, respectively; and an integrated circuit (IC) chip disposed to face a third side between the first and second sides of the flash LED device on the upper surface of the circuit board and processing a signal detected by the first to fourth optical sensors.

According to an aspect of embodiments, a flash light emitting diode (LED) package with optical sensors may include a circuit board; a flash LED device disposed on an upper surface of the circuit board and having a light emission region; and first and second optical sensors disposed to be adjacent to first and second sides of the flash LED device opposing each other on the upper surface of the circuit board, respectively, each of the first and second optical sensors configured to detect light within a first wavelength.

According to an aspect of embodiments, a camera-equipped mobile device may include a housing including a first surface oriented in a first direction and a second surface oriented in a second direction opposite to the first direction; a camera module mounted on at least one of the first and second surfaces of the housing; and a flash light emitting diode (LED) package with optical sensors mounted to be adjacent to the camera module on at least one of the first and second surfaces of the housing and connected through a single optical opening, wherein the flash LED package with optical sensors includes: a circuit board; a flash LED device disposed on an upper surface of the circuit board and having a light emission region; first and third optical sensors arranged to be adjacent to a first side of the flash LED device on the upper surface of the circuit board and configured to detect light of a first wavelength and light of a second wavelength, respectively; second and fourth optical sensors arranged to be adjacent to a second side of the flash LED device positioned opposite to the first side on the upper surface of the circuit board and configured to detect light of the first wavelength and light of the second wavelength; and an integrated circuit (IC) chip disposed to face a third side between the first and second sides of the flash LED device on the upper surface of the circuit board and processing a signal detected by the first to fourth optical sensors.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
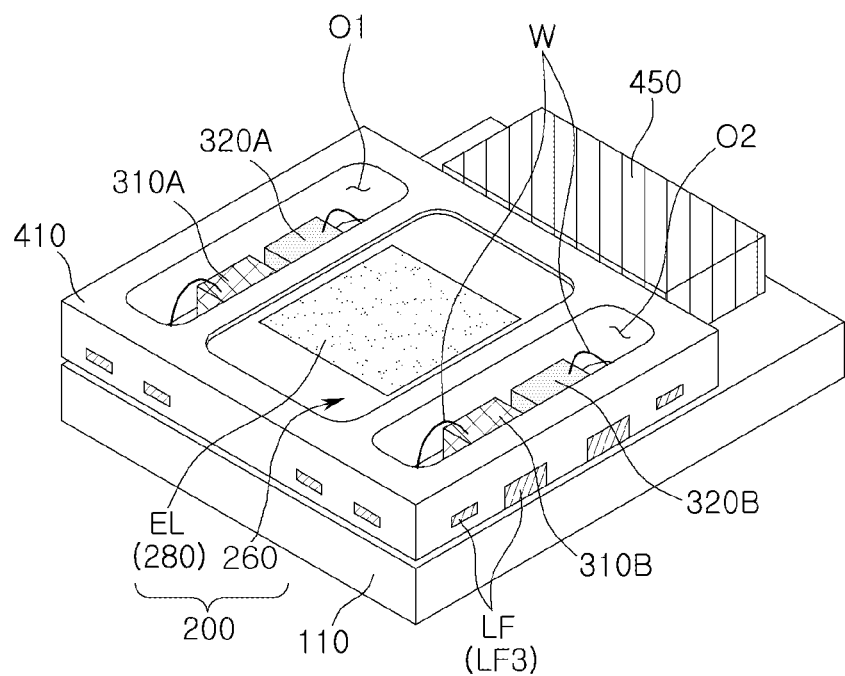
FIG. 1 is a perspective view illustrating a flash light emitting diode (LED) package according to an example embodiment.
Figure 2:
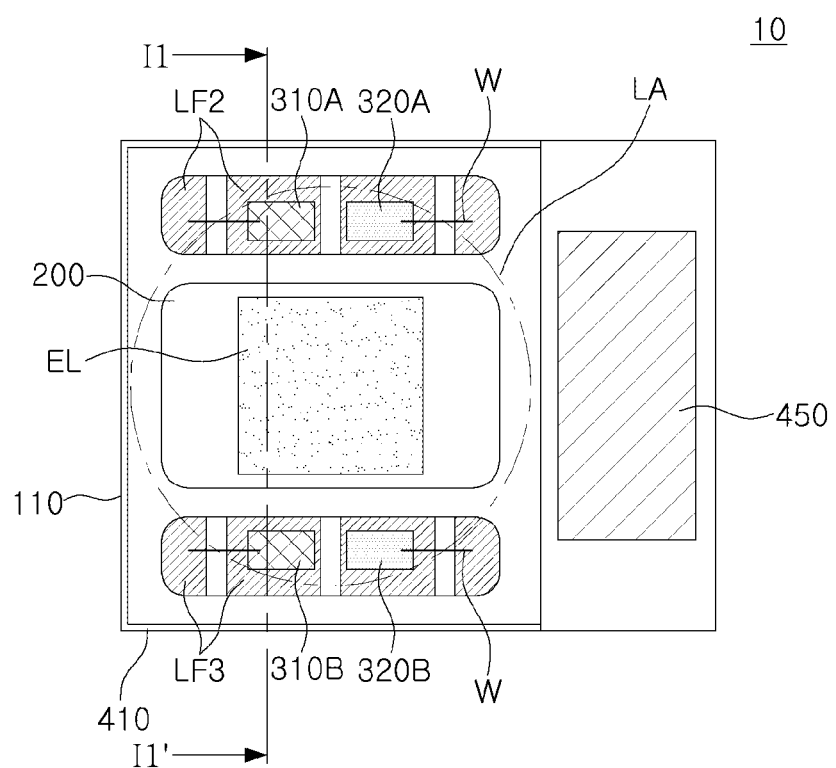
FIG. 2 is a plan view illustrating the flash LED package of FIG. 1.
Figure 3:
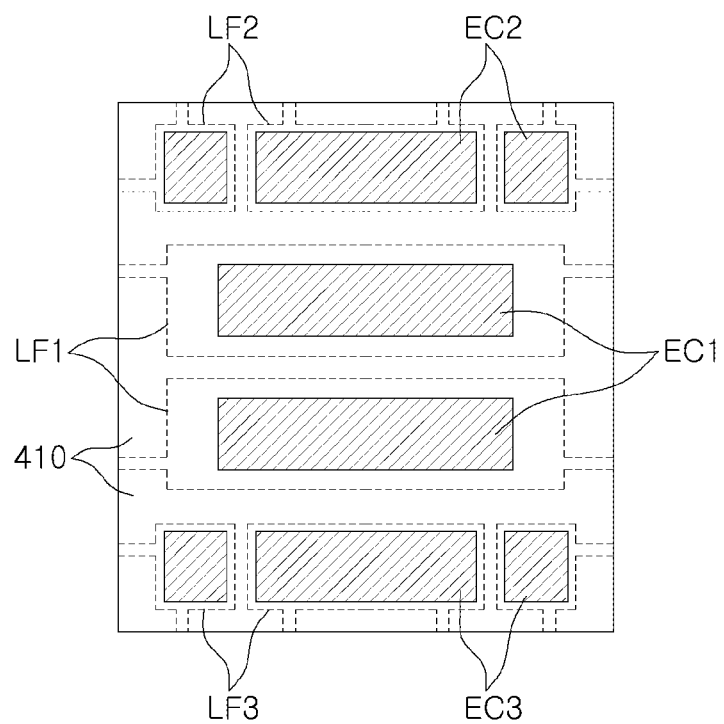
FIG. 3 is a bottom view of a sidewall structure employed in the flash LED package of FIG. 1.
Figure 4:
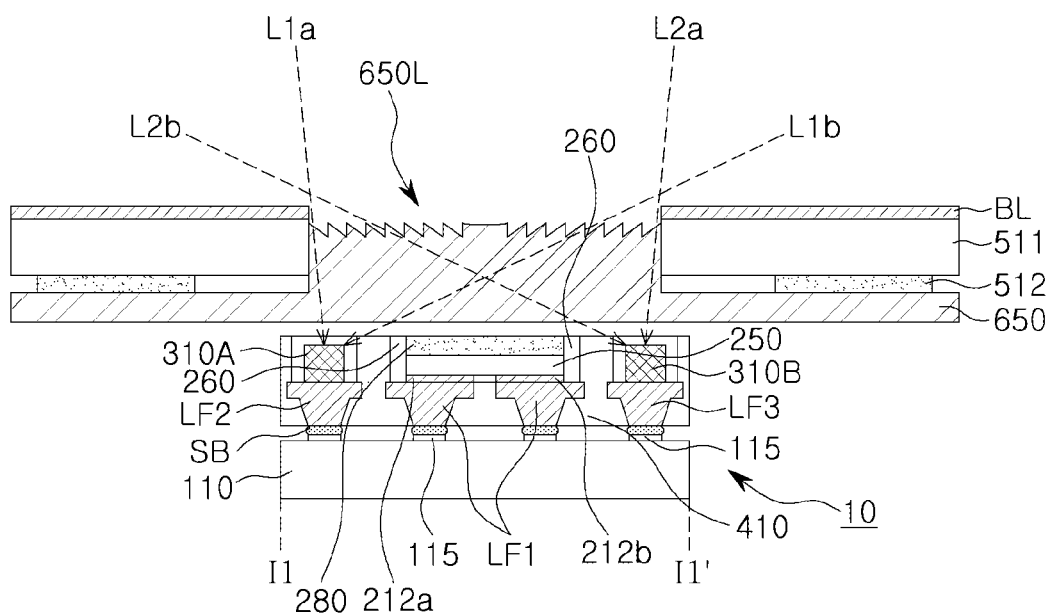
FIG. 4 is a cross-sectional view illustrating the flash LED package of FIG. 1 in an optical system.

FIG. 1 is a perspective view illustrating a flash LED package according to an example embodiment. FIG. 2 is a plan view illustrating the flash LED package of FIG. 1. FIG. 3 is a bottom view of a sidewall structure employed in the flash LED package of FIG. 1. FIG. 4 is a cross-sectional view along line I1-I1' of FIG. 1.

Referring to FIGS. 1 and 2, a flash LED package 10 with sensors (or a "sensor-equipped flash LED package 10) according to a present example embodiment may include a circuit board 110, a flash LED device 200 disposed on an upper surface of the circuit board 110, a plurality of optical sensors 310A, 310B, 320A, and 320B disposed around the flash LED device 200 on an upper surface of the circuit board 110, and an integrated circuit (IC) chip 450 disposed in a region of the upper surface of the circuit board 110. For example, as illustrated in FIG. 1, the plurality of optical sensors 310A, 310B, 320A, and 320B may be aligned along opposite sides of the flash LED device 200.

The circuit board 110 may be, e.g., a printed circuit board (PCB), a metal core PCB (MCPCB), a metal PCB (MPCB), a flexible PCB (FPCB), etc., and the flash LED device 200, the plurality of optical sensors 310A, 310B, 320A, and 320B, and the IC chip 450 may be electrically connected to an electrode pattern 115 (FIG. 4) of the circuit board 110. In the present example embodiment, the flash LED device 200 and the plurality of optical sensors 310A, 310B, 320A, and 320B may be connected to the electrode pattern 115 of the circuit board 110 through a lead frame LF. In some example embodiments, an additional device, e.g., a Zener diode, may be mounted on the circuit board 110.

In the present example embodiment, the flash LED device 200 may include an LED chip 250 (FIG. 4), a reflective structure 260 surrounding the LED chip 250, and a light emission region EL defined by the reflective structure 260 above the LED chip 250. The flash LED device 200 may further include a wavelength conversion layer 280 configured to convert at least a portion of light emitted from the LED chip 250 to emit white light, and the light emission region EL may be provided by the wavelength conversion layer 280. For example, as illustrated in FIG. 4, the wavelength conversion layer 280 may be, e.g., directly, on the LED chip 250, and the reflective structure 260 may surround an entire perimeter of the combined structure of the wavelength conversion layer 280 with the LED chip 250, as viewed in a plan view (FIGS. 1 and 2). For example, the wavelength conversion layer 280 may define, e.g., may be, the light emission region EL above the LED chip 250 and surrounded by the reflective structure 260.

The reflective structure 260 may prevent light from the flash LED device 200 from proceeding toward the plurality of optical sensors 310A, 310B, 320A, and 320B adjacent to the flash LED device 200. The reflective structure 260 may include a resin body containing reflective powder. For example, the resin body may include silicone or an epoxy resin. The reflective powder may be a white ceramic powder or a metal powder. For example, the ceramic powder may be at least one of $TiO_2$, $Al_2O_3$, $Nb_2O_5$, and ZnO. For example, the metal powder may be at least one of Al and Ag.

The flash LED device 200 employed in the present example embodiment may have a chip scale package structure. As illustrated in FIG. 4, the flash LED device 200 may include the LED chip 250, the wavelength conversion layer 280 disposed on the upper surface of the LED chip 250, the reflective structure 260 surrounding the LED Chip 250 and the wavelength conversion layer 280, and the electrode structures 212a and 212b connected to the electrodes of the LED chip 250. Details of the structure of the flash LED device 200 will be described below with reference to FIGS. 6A and 6B.

As further illustrated in FIGS. 1 and 4, the flash LED package 10 according to the present example embodiment may include a sidewall structure 410 surrounding the flash LED device 200. The sidewall structure 410 may include a first opening O1 in which the first and third optical sensors 310A and 320A are positioned, and a second opening O2 for the second and fourth optical sensors 310B and 320B. The first opening O1 and the second opening O2 may be respectively disposed on both sides (i.e., first and second surfaces opposite to each other) of the flash LED device 200.

The sidewall structure 410 may include a lead frame LF electrically connected to the flash LED device 200 and the first to fourth optical sensors 310A, 310B, 320A, and 320B. The sidewall structure 410 may be formed of a material similar to that of the reflective structure 260. For example, the sidewall structure 410 may include a resin body having a white ceramic powder or a metal powder. The bottom view of the sidewall structure 410 will be described in more detail below, with reference to FIG. 3.

As illustrated in FIG. 3, the lead frame LF employed in the present example embodiment may include a first lead frame LF1 on which the flash LED device 200 is mounted, a second lead frame LF2 disposed on one side of the first lead frame LF1 and allowing the first and third optical sensors 310a and 320A to be mounted thereon, and a third frame LF3 disposed on the other side of the first lead frame LF1 and allowing the second and fourth optical sensors 310B and 320B to be mounted thereon. The lead frame LF (e.g., indicated by dashed lines in FIG. 3) may have electrode regions EC1, EC2, and EC3 (e.g. indicated as hatched regions within the dashed lined regions in FIG. 3) exposed on a bottom surface, and the exposed electrode regions EC1, EC2, and EC3 may be connected to the electrode patterns 115 on the circuit board, respectively (see FIG. 4). In the present example embodiment, the flash LED device 200 may be electrically connected to the first lead frame LF1, e.g., in the form of a flip chip. The first and third optical sensors 310A and 320A and the second and fourth optical sensors 310B and 320B may be electrically connected to the second lead frame LF2 and the third lead frame LF3, e.g., using wires W.

Each of the plurality of optical sensors 310A, 310B, 320A, and 320B may include a photodiode for receiving external light. For example, when a camera operates, the flash LED device 200 illuminates, e.g., irradiates or emits, a flash in a dark environment and the plurality of optical sensors 310A, 310B, 320A, and 320B may receive external light in a specific wavelength and provide information (e.g., color mismatch correction and/or flicker removal) for correcting a camera image.

The plurality of optical sensors 310A, 310B, 320A, and 320B may include first and second optical sensors 310A and 310B for receiving light of a first wavelength and third and third optical sensors 320A and 320B for receiving light of a second wavelength. For example, the first and second optical sensors 310A and 310B may be configured to detect light within an infrared band (IR), and the third and fourth optical sensors 320A and 320B may be configured to detect light within a visible light band. In addition, the optical sensors employable in the present example embodiment may be configured to detect light within an ultraviolet band and may further include a pair of optical sensors detecting light within other bands (see FIGS. 11 and 12B). As used herein, the terms "first," "second," and the like are merely for identification and differentiation, and are not intended to imply or require sequential inclusion (e.g., a third element and a fourth element may be described without implying or requiring the presence of a first element or second element).

In the present example embodiment, the plurality of optical sensors 310A, 310B, 320A, and 320B may be disposed around the flash LED device 200. In detail, the optical sensors receiving the same light may be disposed in different regions.

For example, as illustrated in FIGS. 1 and 2, the first optical sensor 310A and the third optical sensor 320A may be disposed on a first side of the flash LED device 200 on the upper surface of the circuit board 110, and the second optical sensor 310B and the fourth optical sensor 320B may be disposed on a second side opposite to the first side of the flash LED device 200 on the upper surface of the circuit board 110. In this manner, the first and third optical sensors 310A and 320A are additionally disposed in regions different from the second and fourth optical sensors 310B and 320B configured to receive light in the same wavelength, respectively, thereby minimizing distortion occurring in light incident on the optical sensor at one side in a specific photographing environment.

FIG. 4 is a cross-sectional view illustrating a state in which the flash LED package 10 of FIG. 1 is introduced into an optical system. Here, the optical system is a camera-equipped mobile device 500 illustrated in FIGS. 15A and 15B, and a cross-section of the flash LED package 10 is a cross-section of the flash LED package 10 of FIG. 2, taken along line I1-I1'.

Referring to FIG. 4, a lens layer 650 may be mounted on the flash LED package 10 according to the present example embodiment. The lens layer 650 may be attached to a housing 510 (FIG. 15A), e.g., to a rear plate 511 of the housing, by an adhesive layer 512. The lens layer 650 may have a lens element 650L overlapping the flash LED package 10, e.g., the lens element 650L may overlap the flash LED package 10 in a top view. In some example embodiments, one surface of the rear plate 511 may include a light blocking layer BL.

The lens element 650L may be used as an optical element capable of uniformly distributing light emitted from the flash LED device 200, e.g., uniformly distributing light emitted from the light emission region EL at a wide angle. In some example embodiments, the lens element 650L may be a Fresnel lens. For example, a field-of-view (FOV) of the lens element 650L may be greater than or equal to 100°, e.g., greater than or equal to about 120°. The area of the lens element 650L may be larger than that of the light emission region EL of the flash LED device 200, e.g., the area of the lens element 650L facing the flash LED package 10 may be larger than the area of the light emission region EL facing the lens element 650L, to sufficiently cover the light emission region EL of the flash LED device 200, e.g., the lens element 650L may completely overlap a surface of the light emission region EL facing the lens element 650L and extend beyond the light emission region EL.

In the present example embodiment, the plurality of optical sensors 310A, 310B, 320A, and 320B may also be arranged to be adjacent to the flash LED device 200 to receive external lights L1a, L1b, L2a, and L2b through the lens element 650L. As illustrated in FIG. 2, the plurality of optical sensors 310A, 310B, 320A, and 320B, as well as the flash LED device 200, may be positioned in the region LA overlapping the lens element 650L. For example, referring to FIG. 2, a surface of the lens element 650L facing the flash LED package 10 (i.e., indicated by the dashed circular line in FIG. 2) may, e.g., completely, overlap the flash LED device 200 and the plurality of optical sensors 310A, 310B, 320A, and 320B.

As such, in the present example embodiment, the first and second optical sensors 310A and 310B may be disposed in the region (LA of FIG. 2) overlapping the lens element 650L on both e.g., opposite, sides of the flash LED device 200 to receive light incident from the lens element 650L. The FOVs La1, L1b and L2a, L2b of light incident on the first and second optical sensors 310A and 310B may vary according to a photographing environment, and accordingly, information based on an optical signal may be distorted. For example, when infrared light received by the first and second optical sensors 310A and 310B is inaccurate, optical information of infrared light for determining an indoor/outdoor environment may be inaccurate, and thus a color shift may occur.

However, according to the present example embodiment, since the first and second optical sensors 310A and 310B receiving light in the same wavelength are arranged bilaterally and symmetrically to both sides of the flash LED device 200 to symmetrically maintain FOV of external light, distortion of information caused due to asymmetry of the FOVs may be minimized. As a result, camera image correction, e.g., color shift correction and/or optical flicker removal, may be effectively performed.

Figure 9:
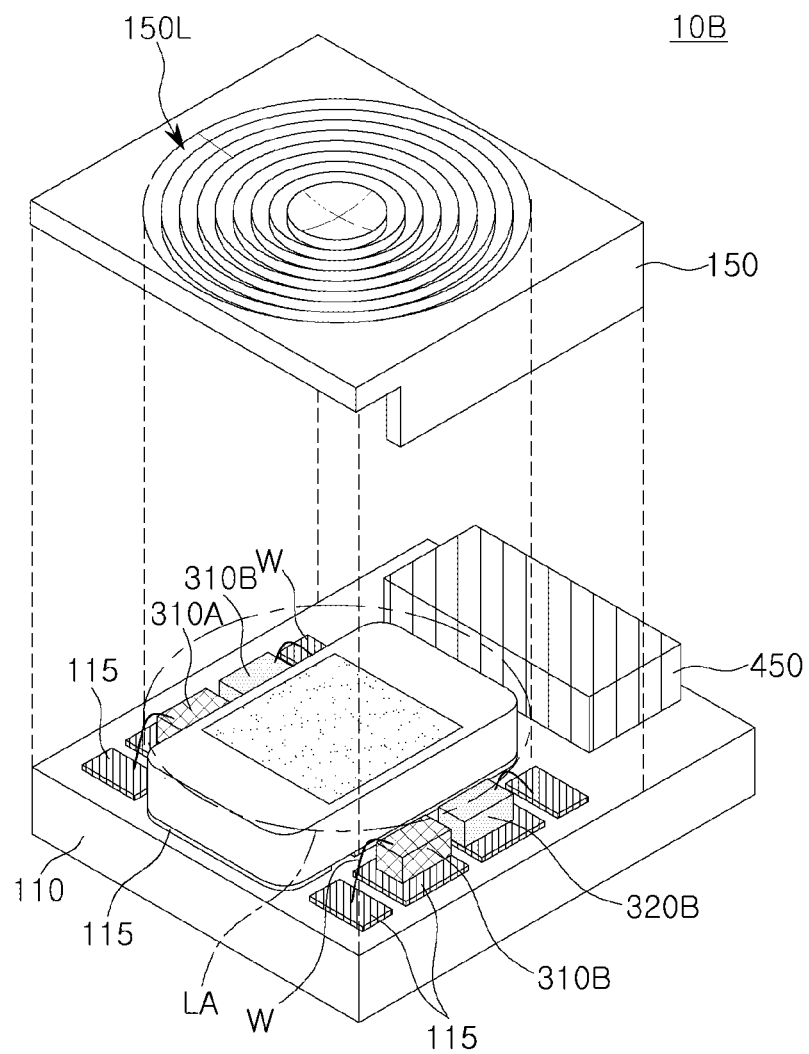
FIG. 9 is a perspective view illustrating a flash LED package according to an example embodiment.

In the present example embodiment, the lens element 650L is mounted on the rear plate 511 (of the housing 510) by the adhesive layer 512, but example embodiments are not limited thereto. For example, as illustrated in FIG. 9, a lens element may also be mounted on a flash LED package with a lens cover.

Figure 5A:
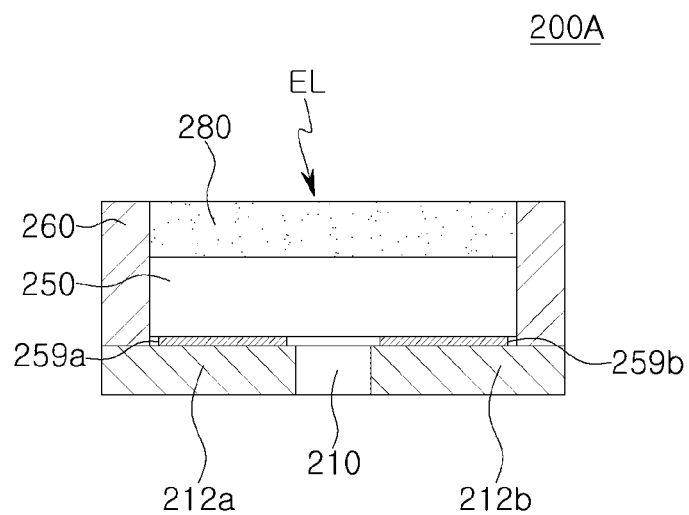
FIGS. 5A and 5B are cross-sectional views of various LED devices employable in a flash LED package according to an example embodiment.
Figure 5B:
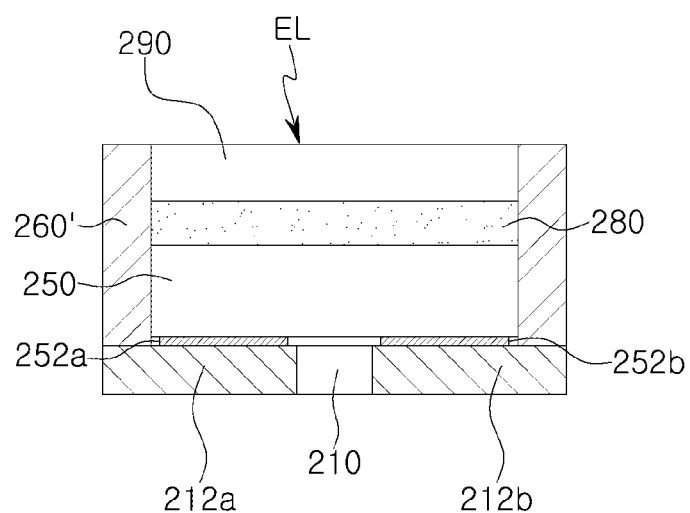

FIGS. 5A and 5B are cross-sectional views of various flash LED devices employable in a flash LED package according to an example embodiment.

Referring to FIG. 5A, a flash LED device 200A according to the present example embodiment may include a wiring board 210 having the first and second electrode structures 212a and 212b, the LED chip 250 mounted on the wiring board 210, and the wavelength conversion layer 280 disposed on an upper surface of the LED chip 250. The LED chip 250 may include first and second electrodes 259a and 259b connected to the first and second electrode structures 212a and 212b, respectively, on a lower surface thereof.

As described above, the flash LED device 200A according to the present example embodiment may further include the reflective structure 260 surrounding the side of the LED chip 250 and the wavelength conversion layer 280. The reflective structure 260 may prevent light emitted from the flash LED device 200A from affecting the optical sensors disposed to be adjacently thereto. In the present example embodiment, the light emission region EL may be provided by the wavelength conversion layer 280 and may be defined by the reflective structure 260.

The wiring board 210 may include, e.g., an insulating resin, a ceramic substrate, and the like. The first and second electrode structures 212a and 212b may include a metal, e.g., Au, Cu, Ag, or Al. When the flash LED device 200A is a chip-scale package, a wiring structure may be directly formed on a lower surface of the LED chip 250 using a semiconductor process at a wafer level.

The wavelength conversion layer 280 may include at least one wavelength conversion material converting a portion of the light emitted from the LED chip 250 into light in a predetermined wavelength different from an emission wavelength. The wavelength conversion layer 280 may be a resin layer in which a ceramic phosphor film or a wavelength conversion material is dispersed. For example, the wavelength conversion material may be at least one of a phosphor and a quantum dot.

For example, the flash LED device 200A may be configured to emit white light. In some example embodiments, the LED chip 250 may emit blue light. For example, the LED chip 250 may emit light having a dominant wavelength in the range of about 440 nm to about 460 nm. The wavelength conversion material may include a phosphor or quantum dot converting a portion of blue light into yellow light or may include a plurality of phosphors or quantum dots converting a portion of blue light into yellow light.

Referring to FIG. 5B, it may be understood that a flash LED device 200B according to the present example embodiment may be similar to the example embodiment illustrated in FIG. 5A, except that the flash LED device 200B may further include a light-transmitting film 290 having a low refractive index. In addition, the components of the present example embodiment may be understood with reference to the descriptions of the same or similar components of the example embodiment illustrated in FIG. 5A, unless otherwise specified.

The flash LED device 200B according to the present example embodiment may further include the light-transmitting film 290 disposed on the wavelength conversion layer 280, and a reflective structure 260' may be formed to further surround the light-transmitting film 290 together with the LED chip 250 and the wavelength conversion layer 280. In the present example embodiment, unlike the previous example embodiment, the reflective structure 260' may be formed to be higher than a height of an upper surface of the wavelength conversion layer 280 to increase the efficiency of condensing light by the lens element ("650L" in FIG. 4). In addition, the final light emission region EL may be provided by the light-transmitting film 290. By introducing the light-transmitting film 290 having a low refractive index, light extraction efficiency may be increased.

As described above, the flash LED devices 200A and 200B employed in the present example embodiment may have a flip-chip structure in which a surface on which the light emission region EL is provided and a surface on which an electrode is formed are opposite to each other. In addition, the flash LED devices 200A and 200B may include a reflective structure 260 surrounding at least the LED chip 250 and the wavelength conversion layer 280 so as to be advantageous in condensing light emitted from the LED chip 250. In some example embodiments, the flash LED devices 200A and 200B may be compact chip scale packages.

Figure 6A:
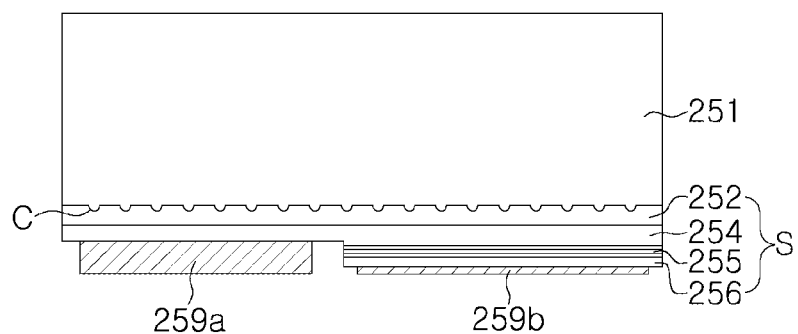
FIGS. 6A and 6B are cross-sectional views illustrating various semiconductor LED chips employable in an LED device.
Figure 6B:
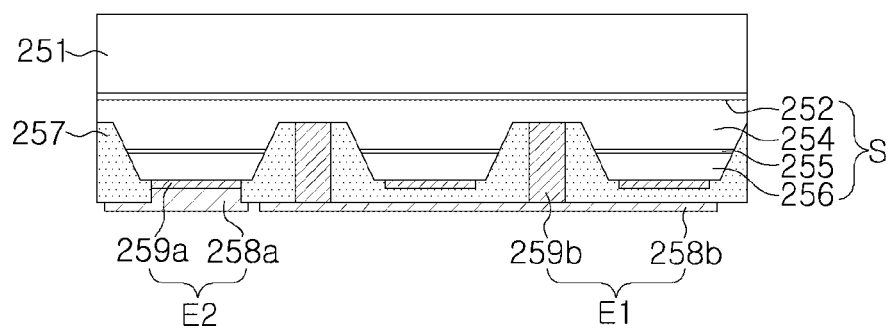

In the flash LED device according to the present example embodiment, various types of LED chips may be employed and may mainly have a flip-chip structure. FIGS. 6A and 6B are cross-sectional views illustrating various semiconductor LED chips employable in a flash LED device.

Referring to FIG. 6A, an LED chip 250A may include a substrate 251 and a semiconductor stack S including a first conductivity-type semiconductor layer 254, an active layer 255, and a second conductivity-type semiconductor layer 256 sequentially disposed on the substrate 251. A buffer layer 252 may be disposed between the substrate 251 and the first conductivity-type semiconductor layer 254.

The substrate 251 may be an insulating substrate, e.g., sapphire. However, embodiments are not limited thereto, e.g., the substrate 251 may be a conductive substrate or a semiconducting substrate. For example, the substrate 251 may be formed of SiC, Si, $MgAl_2O_4$, MgO, $LiAlO_2$, $LiGaO_2$, or GaN in addition to sapphire. An uneven portion C may be formed on a surface of the substrate 251 facing the semiconductor stack S. The uneven portion C may improve the quality of a grown single crystal, while improving light extraction efficiency.

For example, the buffer layer 252 may be $In_xAl_yGa_{1-x-y}N$ ($0 \leq x \leq 1$, $0 \leq y \leq 1$). For example, the buffer layer 252 may be formed of GaN, AlN, AlGaN, or InGaN. If necessary, a plurality of layers may be combined, or some compositions may be gradually changed to be used.

For example, the first conductivity-type semiconductor layer 254 may be a nitride semiconductor satisfying n-type $In_xAl_yGa_{1-x-y}N$ ($0 \leq x < 1$, $0 \leq y < 1$, $0 \leq x+y < 1$), and an n-type impurity may be Si. For example, the first conductivity-type semiconductor layer 254 may include n-type GaN. The second conductivity-type semiconductor layer 256 may be a nitride semiconductor layer satisfying p-type $In_xAl_yGa_{1-x-y}N$ ($0 \leq x < 1$, $0 \leq y < 1$, $0 \leq x+y < 1$), and a p-type impurity may be Mg. For example, the second conductivity-type semiconductor layer 256 may be implemented as a single-layer structure, but may have a multilayer structure having different compositions as in the present example.

The active layer 255 may have a multi-quantum well (MQW) structure in which quantum well layers and quantum barrier layers are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN. A thickness of each of the quantum well layer and the quantum barrier layer may be in the range of about 1 nm to about 50 nm. The active layer 255 is not limited to a multi-quantum well structure, and may have a single quantum well structure.

The first and second electrodes 259a and 259b may be respectively disposed on a mesa-etched region of the first conductivity-type semiconductor layer 254 and the second conductivity-type semiconductor layer 256 to be positioned on the same surface. For example, the first electrode 259a may include at least one of Ag, Ni, Al, Cr, Rh, Pd, Ir, Ru, Mg, Zn, Pt, and Au, and may include a structure of a single layer or two or more layers. If necessary, the second electrode 259b may be a transparent electrode, e.g., a transparent conductive oxide or a transparent conductive nitride, or may include graphene. The second electrode 259b may include at least one of, e.g., Al, Au, Cr, Ni, Ti, and Sn.

FIG. 6B is a side cross-sectional view illustrating an example of another type of a semiconductor LED chip employable in the present example embodiment.

Referring to FIG. 6B, the semiconductor LED chip 250B may include the substrate 251 and the semiconductor stack S disposed on the substrate 251, similarly to the previous example embodiment. The semiconductor stack S may include the buffer layer 252, the first conductivity-type semiconductor layer 254, the active layer 255, and the second conductivity-type semiconductor layer 256.

The LED chip 250B may include first and second electrode structures E1 and E2 respectively connected to the first and second conductivity-type semiconductor layers 254 and 256. For example, the first electrode structure E1 may include a connection electrode 258a, e.g., a conductive via, connected to the first conductivity-type semiconductor layer 254 through the second conductivity-type semiconductor layer 256 and the active layer 255, and a first electrode pad 259b connected to the connection electrode 258a. The connection electrode 258a may be surrounded by an insulating portion 257 to be electrically separated from the active layer 255 and the second conductivity-type semiconductor layer 256. The connection electrode 258a may be disposed in a region in which the semiconductor stack S is etched. The number, shape, pitch of the connection electrode 258a or a contact area of the connection electrode 258a with the first conductivity-type semiconductor layer 254 may be appropriately designed so that contact resistance may be lowered. In addition, the connection electrodes 258a may be arranged to form rows and columns on the semiconductor stack S, thereby improving current flow. The second electrode structure E2 may include an ohmic contact layer 258b and a second electrode pad 259b on the second conductivity-type semiconductor layer 256.

The connection electrode 258a and the ohmic contact layer 258b may each include a single or multilayer structure of a conductive material having ohmic characteristics with the first and second conductivity-type semiconductor layers 254 and 256, and may include, e.g., at least one of Ag, Al, Ni, Cr, a transparent conductive oxide (TCO). The first and second electrodes 259a and 259b may be respectively connected to the connection electrode and the ohmic contact layers 258a and 258b, respectively, and function as external terminals of the LED chip 250B. For example, the first and second electrodes 259a and 259b may be, e.g., at least one of Au, Ag, Al, Ti, W, Cu, Sn, Ni, Pt, Cr, NiSn, TiW, AuSn, or a eutectic metal thereof. The first and second electrode structures E1 and E2 may be disposed in the same direction.

Figure 7:
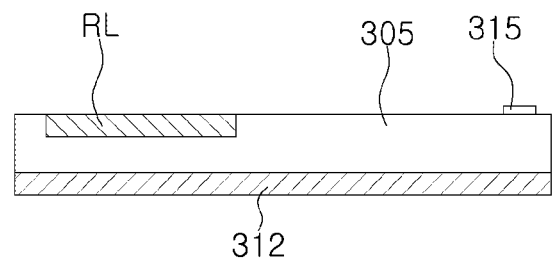
FIG. 7 is a cross-sectional view of an optical sensor employable in a flash LED package according to an example embodiment.

FIG. 7 is a cross-sectional view of an optical sensor employable in a flash LED package according to an example embodiment.

Referring to FIG. 7, an optical sensor 310A according to the present example embodiment may include a chip body 305 having an upper surface on which a light receiving region RL is formed, a first electrode 312 formed on a lower surface of the chip body 305, and a second electrode 315 formed in a region of an upper surface of the chip body 305. For example, as illustrated in FIG. 7, the receiving region RL and the second electrode 315 may be on a same surface of the chip body 305, and both may be on a surface opposite the first electrode 312. The light receiving region RL may include a photodiode array.

As in the present example embodiment, each of the first to fourth optical sensors 310A, 310B, 320A, and 320B may have a light receiving region RL adjacent to one edge, e.g., the light receiving region RL may be adjacent to an edge of the chip body 305. In the first to fourth optical sensors 310A, 310B, 320A, and 320B, the light receiving region RL may be disposed to be adjacent to the flash LED device 200 so that each light receiving region RL may be positioned in the region LA overlapping the lens element (see FIG. 2).

Figure 8A:
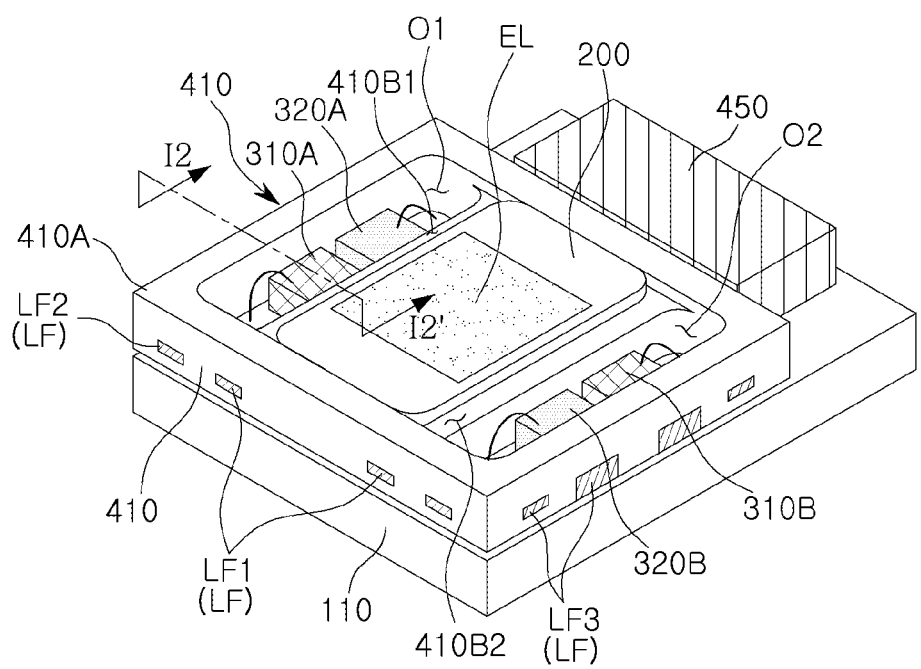
FIG. 8A is a perspective view illustrating a flash LED package according to an example embodiment.
Figure 8B:
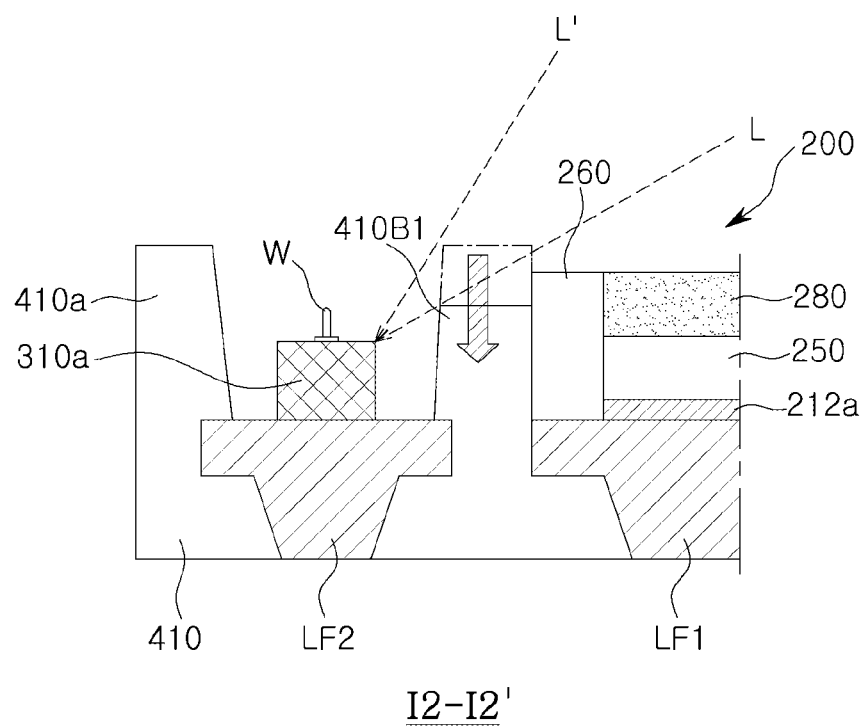
FIG. 8B is a partial cross-sectional view of the flash LED package of FIG. 8A.

FIG. 8A is a perspective view illustrating a flash LED package according to an example embodiment. FIG. 8B is a cross-sectional view of the flash LED package of FIG. 8A, taken along line 12-12'.

Referring to FIGS. 8A and 8B, a flash LED package 10A according to the present example embodiment may be understood as being similar to the flash LED package 10 illustrated in FIGS. 1 to 4, except that heights of inner sidewalls 410B1 and 410B2 of the sidewall structure 410 are adjusted, and the arrangement of the first to fourth optical sensors 310A, 310B, 320A, and 320B is changed. In addition, the components of the present example embodiment may be understood with reference to the description of the same or similar components as the flash LED package 10 illustrated in FIGS. 1 to 4 unless otherwise specified.

The sidewall structure 410 employed in the present example embodiment has the first opening O1, in which the first and third optical sensors 310A and 320A are positioned, and the second opening O2, in which the second and fourth optical sensors 310B and 320B are positioned. In the present example embodiment, the sidewalls adjacent to the flash LED device 200, among the inner sidewalls of the first and second openings O1 and O2, have a relatively low height.

In detail, the sidewall structure 410 employed in the present example embodiment includes an outer sidewall 410A surrounding the flash LED device 200 and the first to fourth optical sensors 310A, 310B, 320A, and 320B, a first inner sidewall 410B1 extending from the outer sidewall 410A and disposed between the flash LED device 200 and the first and third optical sensors 310A and 320A, and a second inner sidewall 410B2 extending from the outer sidewall 410A and disposed between the flash LED device 200 and the second and fourth optical sensors 310B and 320B. The first and second inner sidewalls 410B1 and 410B2 may have a height lower than a height of the outer sidewall 410A, e.g., relative to a bottom of the sidewall structure 410.

As illustrated in FIG. 8B, by lowering the inner sidewall (the first inner sidewall 410B1), light having a lower incident angle lower than that of light L', e.g., as compared to related art, may be incident on the optical sensor (the first optical sensor 310A). As described above, by lowering the height of the inner sidewalls 410B1 and 410B2 of the sidewall structure 410, the amount of light incident on the optical sensor may be increased.

As further illustrated in FIG. 8A, in the present example embodiment, the first and second optical sensors 310A and 310B and the third and fourth optical sensors 320A and 320B are respectively arranged in different diagonal directions passing through the center of the light emission region EL. Accordingly, receiving external light in the same wavelength at both sides of the flash LED device 200 may be improved, thereby minimizing distortion of information and improving camera image correction.

FIG. 9 is a perspective view illustrating a flash LED package according to an example embodiment.

Referring to FIG. 9, a flash LED package 10B according to the present example embodiment may be understood as being similar to the flash LED package 10 illustrated in FIGS. 1 to 4, except that the sidewall structure and the lead frame are omitted and a lens cover 150 is implemented. In addition, the components of the present example embodiment may be understood with reference to the description of the same or similar components of the flash LED package 10 illustrated in FIGS. 1 to 4 unless otherwise specified.

As illustrated in FIG. 9, in the present example embodiment, the flash LED device 200 and the first to fourth optical sensors 310A, 310B, 320A, and 320B may be directly mounted on the electrode pattern 115 on the circuit board 110 to be electrically connected.

In detail, a flash LED package 10B according to the present example embodiment may include the lens cover 150 disposed on the circuit board 110 to cover the flash LED device 200 and the first to fourth optical sensors 310A, 310B, 320A, and 320B. The lens cover 150 has a lens element 150L in a region overlapping the light emission region EL. The lens element 150L may be disposed to have an optical axis passing through the center of the light emission region EL. The area of the lens element 150L may be larger than that of the light emission region EL of the flash LED device 200 to sufficiently cover the light emission region EL of the flash LED device 200. In some example embodiments, the lens element 150L may have an area covering the first to fourth optical sensors 310A, 310B, 320A, and 320B. In the present example embodiment, the lens cover 150 may have a plate shape and may be supported on the circuit board 110 by sidewalls positioned on some sides of the plate. The structure and shape of the lens cover 150 may be variously changed. For example, the lens element 150L may be introduced into the flash LED package 10B as the lens cover 150 instead of being mounted (see FIG. 4) in the housing of the optical system (mobile device).

Figure 10A:
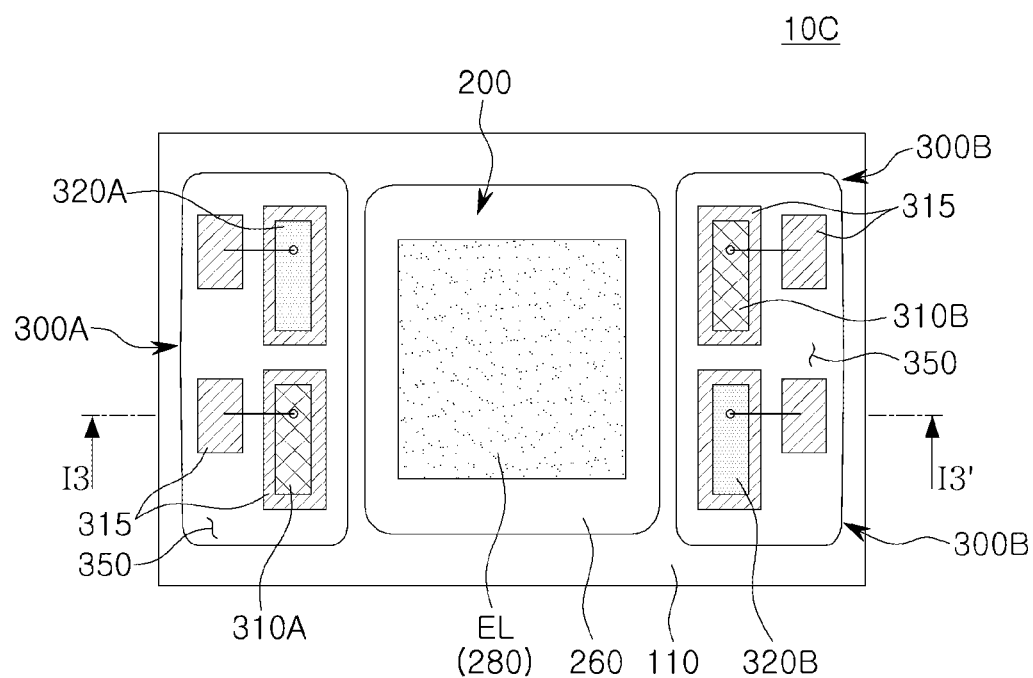
FIGS. 10A and 10B are a plan view and a cross-sectional view illustrating a flash LED package according to an example embodiment.
Figure 10B:
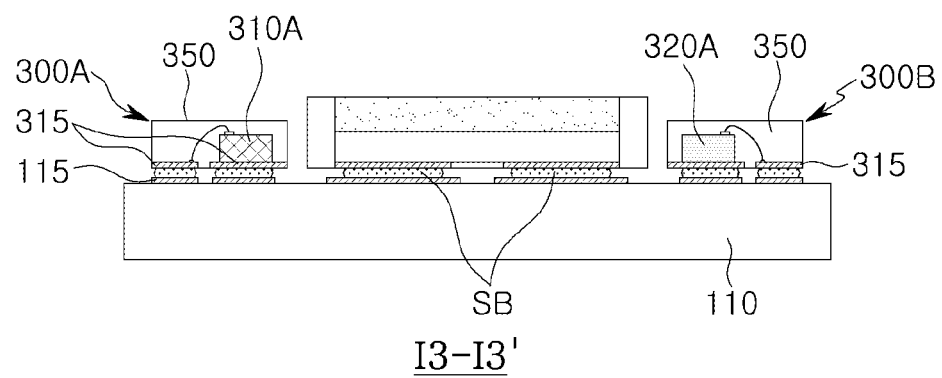

FIG. 10A is a plan view illustrating a flash LED package according to an example embodiment. FIG. 10B is a cross-sectional view of the flash LED package of FIG. 10A taken along line I3-I3'.

Referring to FIGS. 10A and 10B, a flash LED package 10C according to the present example embodiment may be understood as being similar to the flash LED package 10 illustrated in FIGS. 1 to 4, except that the sidewall structure and the lead frame are omitted and optical sensors are employed as package structures. In addition, the components of the present example embodiment may be understood with reference to the description of the same or similar components of the flash LED package 10 illustrated in FIGS. 1 to 4 unless otherwise specified.

As illustrated in FIGS. 10A and 10B, in the present example embodiment, the flash LED device 200 may be mounted directly on the electrode pattern 115 on the circuit board 110 to be electrically connected.

In the present example embodiment, the first to fourth optical sensors 310A, 310B, 320A, and 320B may be manufactured in advance as a package structure and directly mounted on the electrode pattern 115 on the circuit board 110. As illustrated in FIGS. 10A and 10B, the flash LED package 10C according to the present example embodiment may include a first optical sensor package 300A including the first and third optical sensors 310A and 320A, and a second optical sensor package 300B including the second and fourth optical sensors 310B and 320B. The first and second optical sensor packages 300A and 300B may be respectively disposed to be adjacent to both sides of the flash LED device 200 on the circuit board 110.

The first and second optical sensor packages 300A and 300B may include a transparent molded portion 350 surrounding the corresponding optical sensors 310A, 320A and 310B and 320B, respectively, and a plurality of electrode layers, i.e., second electrodes 315, disposed on a lower surface of the transparent molded portion 350. The first and second optical sensor packages 300A and 300B may be connected to the electrode pattern 115 on the circuit board 110 through the plurality of electrode layers by an electrical connection unit, e.g., a solder ball SB.

Figure 11:
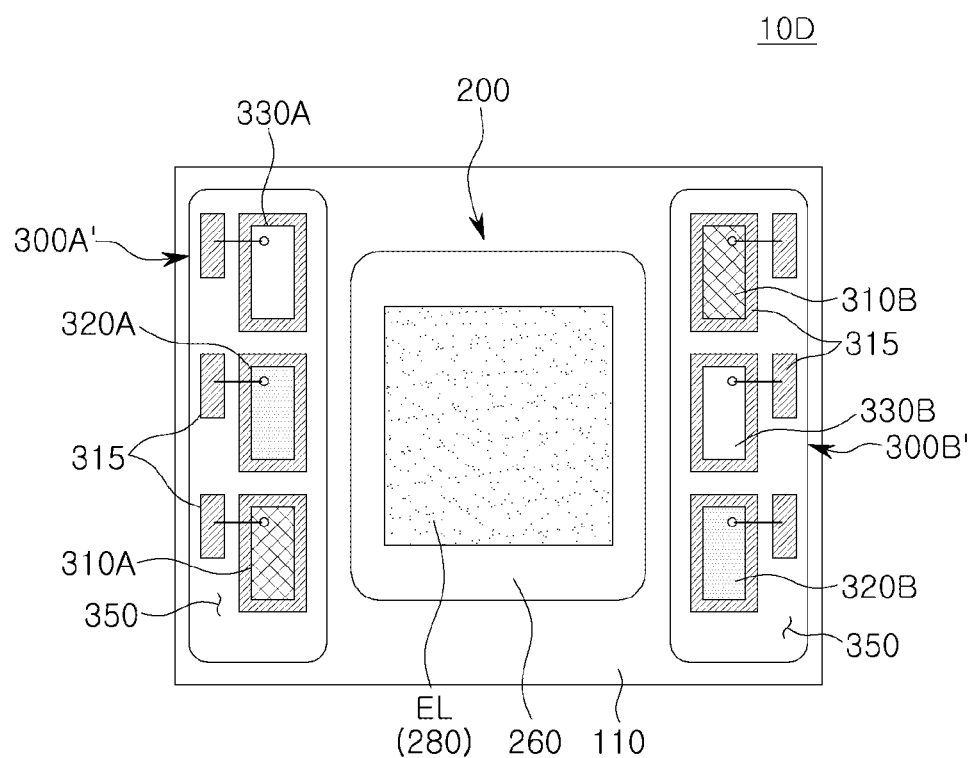
FIG. 11 is a plan view illustrating a flash LED package according to an example embodiment.

FIG. 11 is a plan view illustrating a flash LED package according to an example embodiment.

Referring to FIG. 11, a flash LED package 10D according to the present example embodiment may be understood as being similar to the flash LED package 10C illustrated in FIGS. 10A and 10B, except that optical sensor packages 300A' and 300B' each include three optical sensors. In addition, the components of the present example embodiment may be understood with reference to the description of the same or similar components of the flash LED package 10C illustrated in FIGS. 10A and 10B unless otherwise specified.

As illustrated in FIG. 11, the flash LED package 10D according to the present example embodiment may further include a fifth optical sensor 330A and a sixth optical sensor 330B for receiving light of a third wavelength, different from the first wavelength (the first and second optical sensors) and the second wavelength (the third and fourth optical sensors). For example, the light of the third wavelength may be light within an ultraviolet band.

The flash LED package 10D according to the present example embodiment may include a first optical sensor package 300A' including the first, third, and fifth optical sensors 310A, 320A, and 330A, and a second optical sensor package 300B' including the second and fourth optical sensors 310B and 320B. The first and second optical sensor packages 300A' and 300B' may be disposed to be adjacent to both sides of the flash LED device 200 on the circuit board 110, respectively.

In the first and second optical sensor packages 300A' and 300B', the arrangement of the respective optical sensors may be variously changed. For example, optical sensors for sensing the same wavelength may be arranged to be positioned side by side in a transverse direction.

Figure 12A:
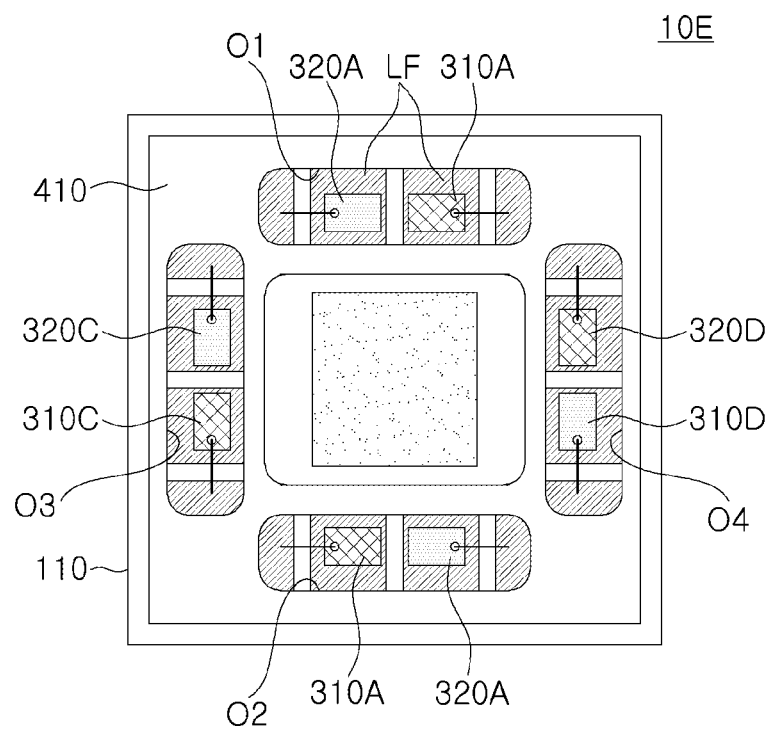
FIGS. 12A and 12B are plan views illustrating a flash LED package according to various example embodiments.
Figure 12B:
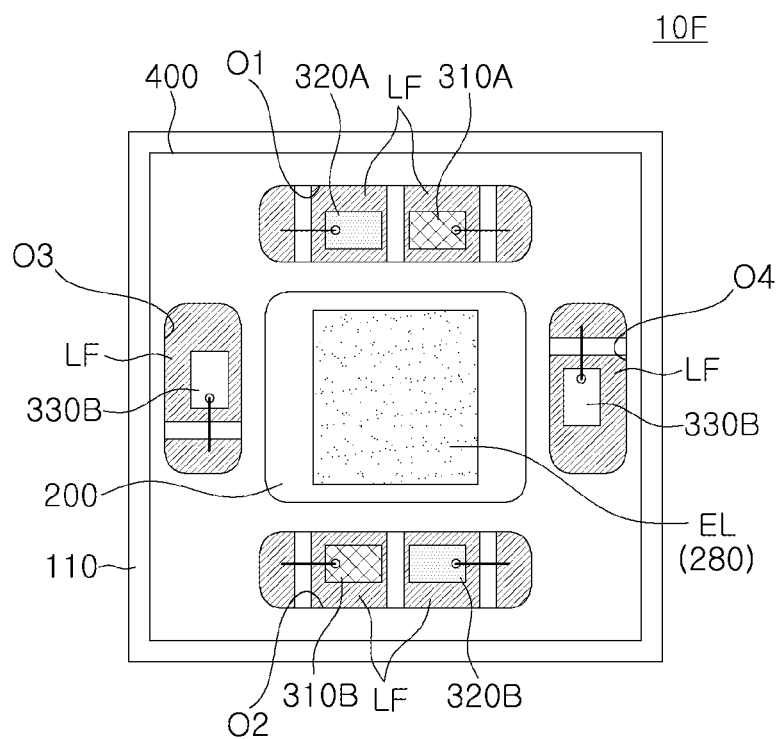

In the above example embodiments, only the form in which the optical sensors are disposed to be adjacent to opposite sides of the flash LED device is illustrated, but optical sensors may be disposed on each of the four sides of the flash LED device. FIGS. 12A and 12B are plan views illustrating a flash LED package according to such example embodiments.

Referring to FIG. 12A, a flash LED package 10E according to the present example embodiment may be understood as being similar to the flash LED package 10 illustrated in FIGS. 1 to 4, except that the same groups of optical sensors are respectively disposed on all the four sides of the flash LED device 200 and an IC chip may be omitted. In addition, the components of the present example embodiment may be understood with reference to the description of the same or similar components of the flash LED package 10 illustrated in FIGS. 1 to 4 unless otherwise specified.

As illustrated in FIG. 12A, the flash LED package 10E according to the present example embodiment includes the sidewall structure 410 surrounding the flash LED device 200 and having first to fourth openings O1, O2, O3, and O4 respectively corresponding to four sides of the flash LED device 200.

The flash LED package 10E includes four first optical sensors 310A, 310B, 310C, and 310D configured to receive light of a first wavelength and four second optical sensors 320A, 320B, 320C, and 320D configured to receive light of a second wavelength. Similar to the previous example embodiment, a pair of first and second optical sensors 310A, 320A and 310B, 320B are disposed in the first and second openings O1 and O2 facing each other, respectively, and another pair of first and second optical sensors 310C, 320C and 310D, 320D are disposed additionally in the third and fourth openings O3 and O4 facing each other.

The flash LED package 10E according to the present example embodiment may not include an IC chip. The IC chip may be disposed on another main board electrically connected to the circuit board 110.

Referring to FIG. 12B, a flash LED package 10F according to the present example embodiment may be understood as being similar to the flash LED package 10E illustrated in FIG. 12A, except that third optical sensors 330A and 330B for receiving light in a third wavelength are disposed to be adjacent to two opposite sides of the flash LED device 200. In addition, the components of the present example embodiment may be understood with reference to the description of the same or similar components of the flash LED package 10E illustrated in FIG. 12A unless otherwise specified.

As illustrated n FIG. 12B, the flash LED package 10F according to the present example embodiment includes the sidewall structure 410 surrounding the flash LED device 200 and having first to fourth openings O1, O2, O3, and O4 respectively corresponding to four sides of the flash LED device 200.

The flash LED package 10F includes two first optical sensors 310A and 310B configured to receive light of a first wavelength, two second optical sensors 320A and 320B configured to receive light of a second wavelength, and two third optical sensors 330A and 330B configured to receive light of a third wavelength. A pair of first and second optical sensors 310A, 320A and 310B, 320B are disposed in the first and second openings O1 and O2 facing each other, respectively, and third optical sensors 310C and 320C are disposed additionally in the third and fourth openings O3 and O4 facing each other.

Figure 13A:
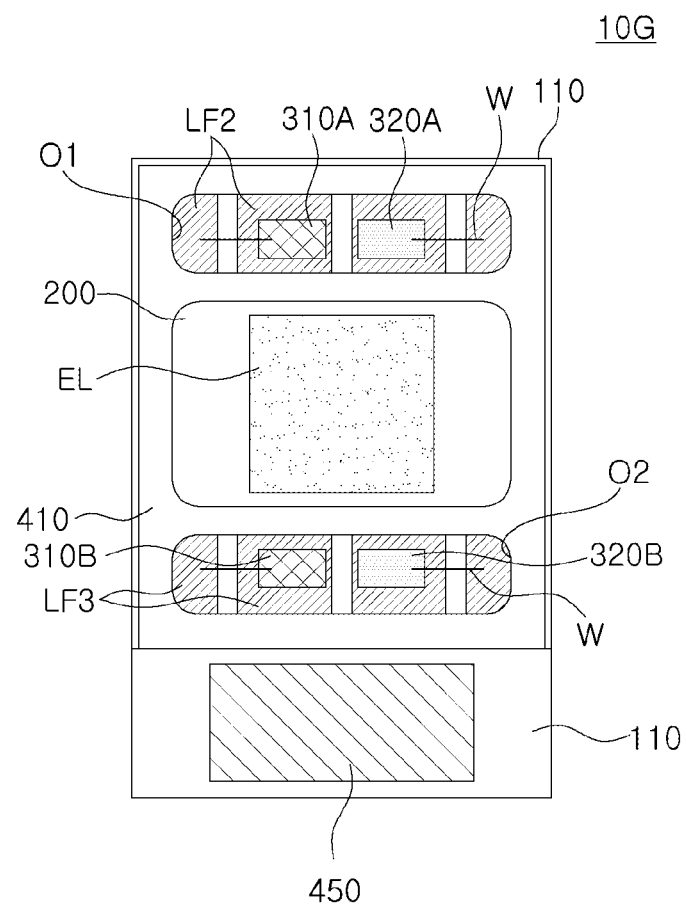
FIGS. 13A and 13B are a plan view and a cross-sectional view of a flash LED package according to various example embodiments, respectively.
Figure 13B:
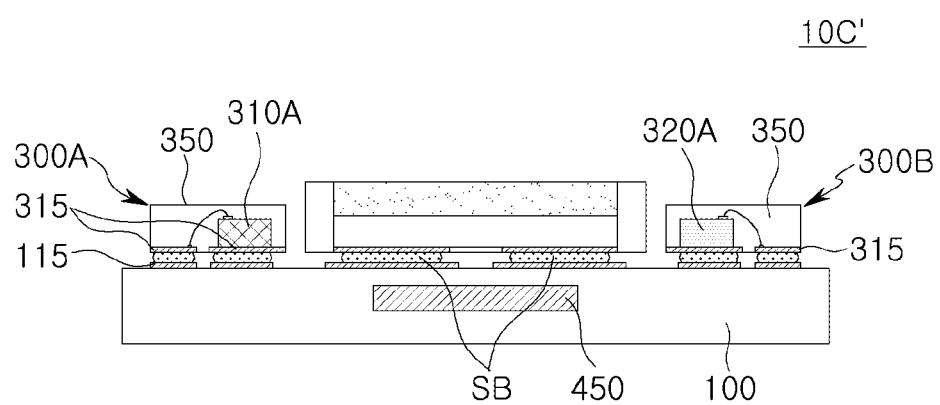

For example, in the above example embodiments, the IC chip may be disposed to face the side on which the optical sensor is not disposed or may be omitted to be disposed in another region. FIGS. 13A and 13B are plan views illustrating a flash LED package according to other example embodiments.

FIGS. 13A and 13B are a plan view and a cross-sectional view of a flash LED package according to various example embodiments, respectively.

Referring to FIG. 13A, a flash LED package 10G according to the present example embodiment may be understood as being similar to the flash LED package 10 illustrated in FIGS. 1 to 4, except that the IC chip 450 faces the side on which the optical sensors 310B and 320B are disposed, among the sides of the flash LED device 200. In addition, the components of the present example embodiment may be understood with reference to the description of the same or similar components of the flash LED package 10 illustrated in FIGS. 1 to 4 unless otherwise specified. In the present example embodiment, the IC chip 450 may be disposed to face the side of the flash LED device 200 on which the optical sensors 310B and 320B are disposed.

Alternatively, the flash LED package 10C' illustrated in FIG. 13B may include an IC chip 450 embedded in the circuit board 110 and may be understood as being similar to the flash LED package 10C illustrated in FIGS. 12A and 12B. FIG. 13B may be understood as a cross-section corresponding to the cross-section illustrated in FIG. 12B.

Figure 14A:
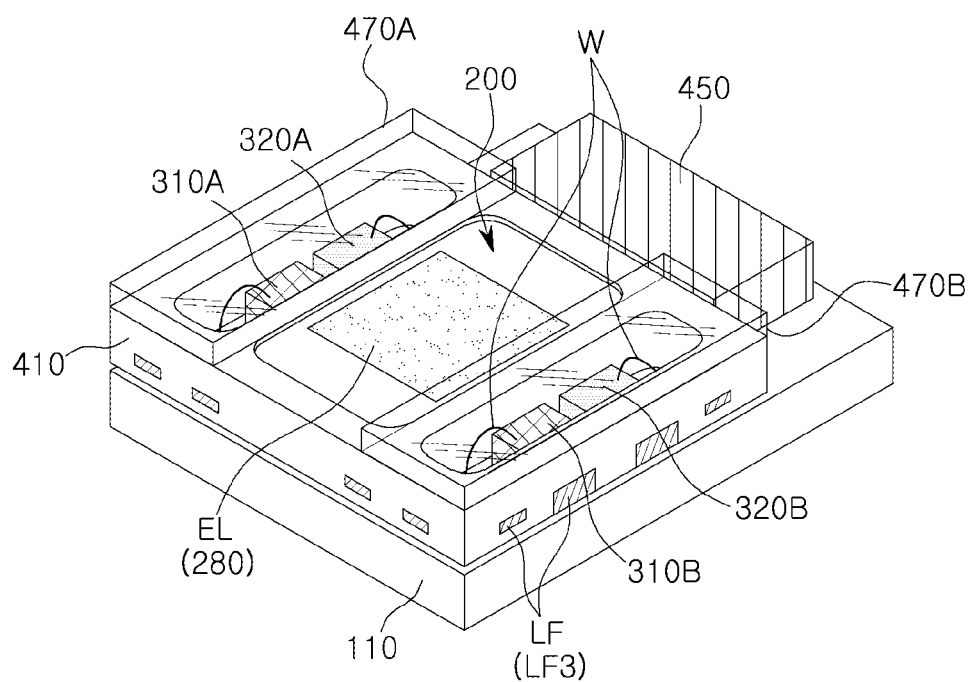
FIGS. 14A and 14B are cross-sectional views illustrating flash LED packages according to various example embodiments.
Figure 14B:
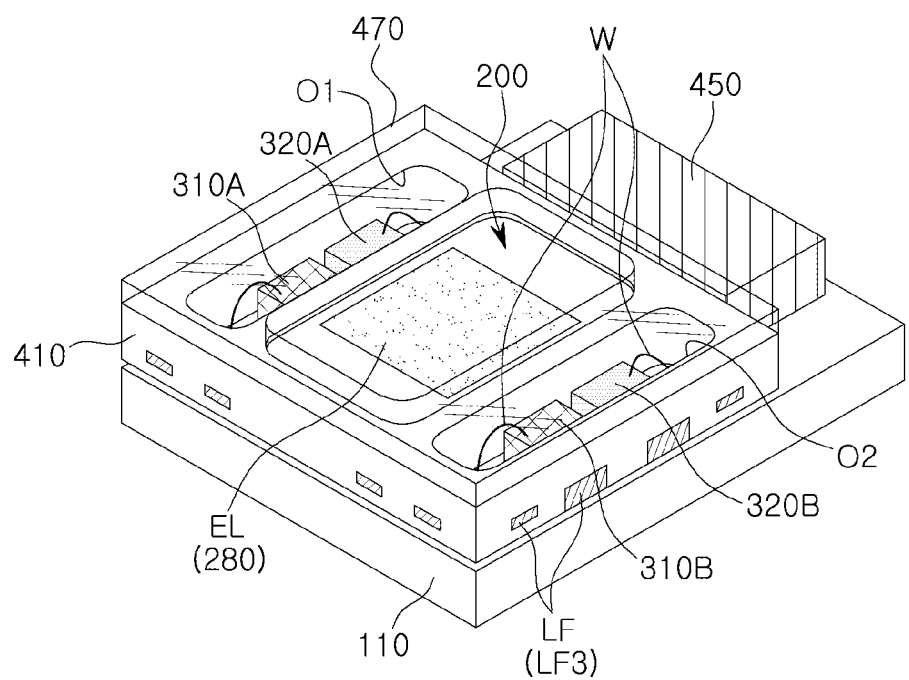

FIGS. 14A and 14B are cross-sectional views illustrating a flash LED package according to an example embodiment.

Referring to FIG. 14A, a flash LED package 10H according to the present example embodiment may be understood as being similar to the flash LED package 10 illustrated in FIGS. 1 to 4, except that the flash LED package 10H further includes a first transparent cover 470A and a second transparent cover 470B covering the first opening O1 and the second opening O2 of the sidewall structure 410, respectively. In addition, the components of the present example embodiment may be understood with reference to the description of the same or similar components of the flash LED package 10 illustrated in FIGS. 1 to 4 unless otherwise specified.

In addition, referring to FIG. 14B, a flash LED package 10H' according to the present example embodiment may be understood as being similar to the flash LED package 10 illustrated in FIGS. 1 to 4, except that the flash LED package 10H' further includes a single transparent cover 470 covering the first opening O1 and the second opening O2 of the sidewall structure 410. In addition, the components of the present example embodiment may be understood with reference to the description of the same or similar components of the flash LED package 10 illustrated in FIGS. 1 to 4 unless otherwise specified.

The sensor-integrated flash LED package according to the present example embodiment may be advantageously applied to other various types of mobile devices or optical systems equipped with a camera, in addition to the mobile communication terminal in the previous example embodiment.

Figure 15A:
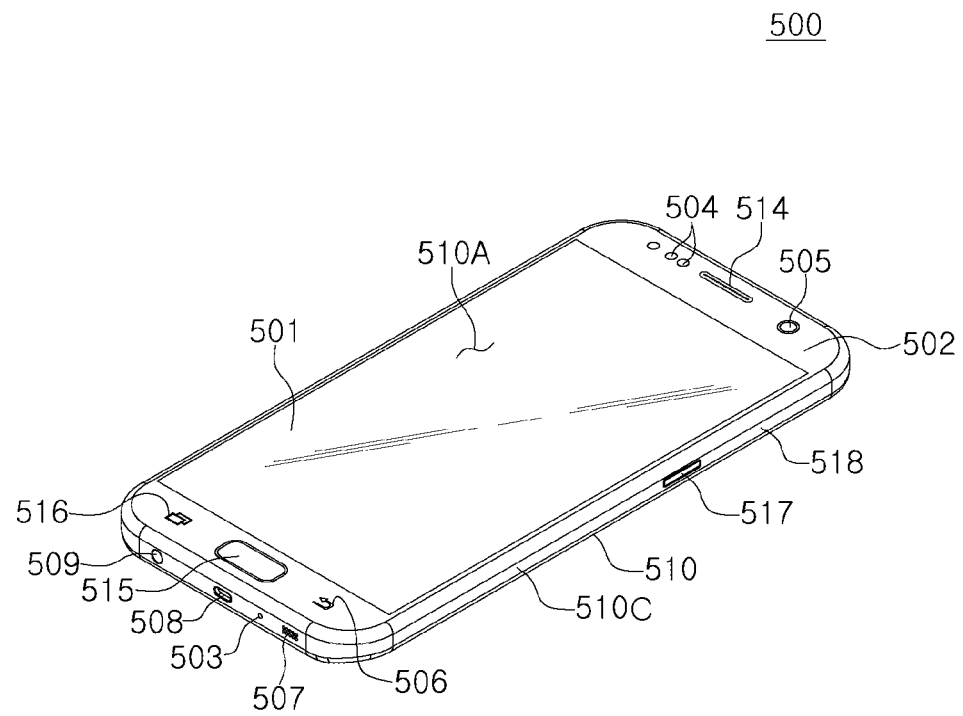
FIGS. 15A and 15B are perspective views illustrating front and rear views of a camera-equipped mobile device according to an example embodiment.
Figure 15B:
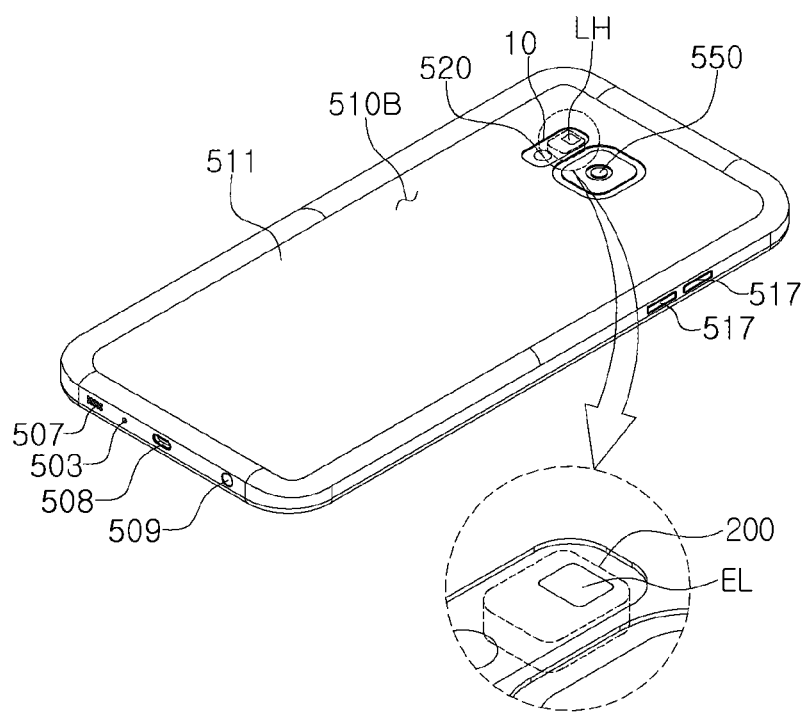

FIGS. 15A and 15B are front and rear perspective views respectively illustrating front and rear surfaces of a camera-equipped mobile device according to an example embodiment.

Referring to FIGS. 15A and 15B, a mobile device 500 according to the present example embodiment may include a housing 510. The housing 510 may include a first surface (e.g., the front surface 510A), a second surface (e.g., the rear surface 510B), and a side surface 510C surrounding a space between the first surface 510A and the second surface 510B.

In an example embodiment, the first surface 510A may be formed by a front plate 502 (e.g., glass or polymer including various coating layers) at least a portion of which is substantially transparent. The second surface 510B may be formed of a substantially opaque rear plate 511. The rear plate 511 may be formed of, e.g., coated or colored glass, ceramic, polymer, metal, or a combination of at least two of the above materials. The side surface 510C may be coupled to the front plate 502 and the rear plate 511 and may be formed of a side bezel structure 518 (or "side member") including a metal and/or a polymer.

The mobile device 500 according to the present example embodiment may include at least one of a display 501, audio modules 503, 507, and 514, sensor modules 504 and 520, a plurality of camera modules 505 and 550, key input devices 515, 516, and 517, an indicator 506, and connector holes 508 and 509. In some example embodiments, in the mobile device 500, at least one of the aforementioned components may be omitted, or the mobile device 500 may additionally include other components.

For example, the display 501 may be exposed through a substantial portion of the front plate 502. The display 501 may be coupled to or disposed to be adjacent to a touch sensing circuit, a pressure sensor capable of measuring the intensity (pressure) of a touch, and/or a digitizer detecting a magnetic field-type stylus pen.

The audio modules 503, 507, and 514 may include a microphone hole 503 and speaker holes 507 and 514. In the microphone hole 503, e.g., a microphone for acquiring an external sound, may be disposed therein, e.g., a plurality of microphones may be disposed to detect a direction of a sound. The speaker holes 507 and 514 may include an external speaker hole 507 and a receiver hole 514 for a call. In some example embodiments, the speaker holes 507 and 514 and the microphone hole 503 may be implemented as a single hole, or a speaker may be included without the speaker holes 507 and 514.

The camera modules 505 and 550 may be respectively disposed on the first surface 510A and the second surface 510B of the mobile device 500. These camera modules 505 and 550 may include one or more lenses, an image sensor, and/or an image signal processor.

The sensor modules 504 and 520 may generate electrical signals or data values corresponding to an internal operating state of the mobile device 500 or an external environmental state. The sensor modules 504 and 520 may be, e.g., proximity sensors. The sensor-integrated flash LED package 10 according to the present example embodiment is a module in which an optical sensor and a flash LED device are integrated, and may be disposed to be adjacent to the camera module 550. The symmetrically arranged optical sensors of the flash LED packages 10 and 10A to 10H may effectively correct a camera image based on information, e.g., flicker, color, and brightness obtained by receiving ambient light, while minimizing distortion caused by a photographing environment.

For example, as illustrated in FIG. 15B, the flash LED package 10 may be disposed to be adjacent to only the rear camera module 550. In another example, a flash LED package according to example embodiments, e.g., any one of the flash LED packages 10 and 10A to 10H may be integrated with an optical sensor for the front camera module 505.

The key input devices 515, 516, and 517 may include a home key button 515 disposed on the first surface 510A of the housing 510, a touch pad 516 disposed around the home key button 515, and/or a side key button 517 disposed on the side surface 510C of the housing 510. In some example embodiments, the mobile device 500 may not include some or all of the components described above, and may instead be implemented as another input unit, e.g., a soft key on the display 501.

The indicator 506 may be disposed, e.g., on the first surface 510A of the housing 510. The indicator 506 may provide status information of the mobile device 500 in the form of light, e.g., and may include an LED. The connector holes 508 and 509 may include a first connector hole 508 accommodating a connector (e.g., a USB connector) for transmitting and receiving power and/or data to and from an external electronic device and/or a second connector hole (e.g., earphone jack) 509 accommodating a connector for transmitting and receiving audio signals to and from an external electronic device.

By way of summation and review, embodiments provide an optical sensor-integrated flash LED package having an excellent function of sensing ambient light. That is, according to example embodiments, an optical sensor-integrated flash LED package includes a plurality of optical sensors receiving light in a same wavelength in different regions around the flash LED device (e.g., in different regions symmetrically arranged around the light emission region), thereby maintaining a viewing angle of external light symmetrically. Accordingly, information that may be distorted according to an imaging environment, e.g., color distortion and/or optical flicker, may be minimized or effectively corrected.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flash light emitting diode (LED) package, comprising:
   a circuit board;
   a flash LED device on an upper surface of the circuit board, the flash LED device having a light emission region;
   first and third optical sensors on the upper surface of the circuit board, the first and third optical sensors being adjacent to a first side of the flash LED device, and the first and third optical sensors being configured to detect light of a first wavelength and light of a second wavelength, respectively;
   second and fourth optical sensors on the upper surface of the circuit board, the second and fourth optical sensors being adjacent to a second side of the flash LED device opposite to the first side, and the second and fourth optical sensors being configured to detect light of the first wavelength and light of the second wavelength, respectively; and
   an integrated circuit (IC) chip on the upper surface of the circuit board, the IC chip facing a third side between the first side and the second side of the flash LED device, the IC chip being configured to process a signal detected by the first to fourth optical sensors,
   wherein the first to fourth optical sensors overlap at least a portion of the flash LED device in a horizontal direction, the horizontal direction being parallel to the upper surface of the circuit board.

2. The flash LED package as claimed in claim 1, further comprising fifth and sixth optical sensors adjacent to the first side and the second side, respectively, the fifth and sixth optical sensors being configured to detect light of a third wavelength.

3. The flash LED package as claimed in claim 1, further comprising fifth and sixth optical sensors adjacent to third and fourth sides, respectively, the third and fourth sides being opposite to each other and different from the first side and the second side, respectively, and the fifth and sixth optical sensors being configured to detect light of a third wavelength.

4. The flash LED package as claimed in claim 1, wherein:
   the first and second optical sensors are arranged in a first diagonal direction based on a center of the light emission region, and
   the third and fourth optical sensors are arranged in a second diagonal direction based on the center of the light emission region.

5. The flash LED package as claimed in claim 1, wherein:
   the first and third optical sensors and the second and fourth optical sensors are provided as first and second optical sensor packages, respectively, and
   each of the first and second optical sensor packages includes a molded portion surrounding corresponding ones of the first to fourth optical sensors, respectively, and a plurality of electrode layers on a lower surface of the molded portion.

6. The flash LED package as claimed in claim 1, wherein each of the first to fourth optical sensors has a light receiving region adjacent to one edge, the light receiving region being adjacent to the flash LED device.

7. The flash LED package as claimed in claim 1, further comprising a sidewall structure, the sidewall structure including:
   an outer sidewall surrounding the flash LED device and the first to fourth optical sensors,
   a first inner sidewall extending from the outer sidewall, the first inner sidewall being between the flash LED device and the first and third optical sensors, and
   a second inner sidewall extending from the outer sidewall, the second inner sidewall being between the flash LED device and the second and fourth optical sensors.

8. The flash LED package as claimed in claim 7, wherein the first and second inner sidewalls have a height lower than a height of the outer sidewall.

9. The flash LED package as claimed in claim 7, wherein the sidewall structure includes a lead frame exposed to a bottom of the sidewall structure, the lead frame including:
- a first lead frame on which the flash LED device is mounted,
- a second lead frame on a first side of the first lead frame, the first and third optical sensors being mounted on the second lead frame, and
- a third lead frame on a second side of the first lead frame, the second and fourth optical sensors being mounted on the third lead frame.

10. The flash LED package as claimed in claim 7, further comprising a transparent cover on the sidewall structure, the transparent cover covering the first and third optical sensors and the second and fourth optical sensors.

11. The flash LED package as claimed in claim 1, further comprising a lens cover on the circuit board, the lens cover covering the flash LED device and the first to fourth optical sensors, and the lens cover having a lens in a region overlapping the light emission region.

12. The flash LED package as claimed in claim 11, wherein the lens includes a Fresnel lens having an optical axis passing through a center of the light emission region.

13. The flash LED package as claimed in claim 11, wherein the lens has an area greater than an area of the light emission region, the lens overlapping at least a portion of the first to fourth optical sensors in a direction perpendicular to as the upper surface of the circuit board.

14. The flash LED package as claimed in claim 1, wherein:
- the flash LED device includes an LED chip, a wavelength conversion layer covering the LED chip, and a reflective structure surrounding sides of the wavelength conversion layer and the LED chip, and
- the reflective structure is defined by the light emission region of the flash LED device.

15. A flash light emitting diode (LED) device, comprising:
- a circuit board;
- a flash LED device on an upper surface of the circuit board, the flash LED device having a light emission region; and
- first and second optical sensors on the upper surface of the circuit board, the first and second optical sensors being adjacent to first and second opposite sides of the flash LED device, respectively, and each of the first and second optical sensors being configured to detect light of a first wavelength, wherein the first and second optical sensors overlap at least a portion of the flash LED device in a horizontal direction, the horizontal direction being parallel to the upper surface of the circuit board.

16. The flash LED device as claimed in claim 15, further comprising third and fourth optical sensors on the upper surface of the circuit board, the third and fourth optical sensors being adjacent to third and fourth opposite sides of the flash LED device, respectively, and each of the third and fourth optical sensors being configured to detect light of a second wavelength.

17. The flash LED device as claimed in claim 15, further comprising third and fourth optical sensors adjacent to the first and second opposite sides of the flash LED device, respectively, each of the third and fourth optical sensors being configured to detect light within a second wavelength.

18. The flash LED device as claimed in claim 17, further comprising an integrated circuit (IC) chip in a region of the circuit board, the IC chip being configured to process a signal detected by the first to fourth optical sensors.

19. The flash LED device as claimed in claim 18, wherein the IC chip faces a side of the flash LED device different from the first and second opposite sides of the flash LED device.

20. A flash light emitting diode (LED) package, comprising:
- a circuit board;
- a flash LED device on an upper surface of the circuit board, the flash LED device having a light emission region;
- first and third optical sensors on the upper surface of the circuit board, the first and third optical sensors being adjacent to a first side of the flash LED device and configured to detect light of a first wavelength and light of a second wavelength, respectively;
- second and fourth optical sensors on the upper surface of the circuit board, the second and fourth optical sensors being adjacent to a second side of the flash LED device and configured to detect light of the first wavelength and light of the second wavelength, respectively; and
- an integrated circuit (IC) chip in a region of the circuit board, the IC chip being configured to process a signal detected by the first to fourth optical sensors, wherein the first to fourth optical sensors overlap at least a portion of the flash LED device in a horizontal direction, the horizontal direction being parallel to the upper surface of the circuit board, and wherein the second side is opposite to the first side.

* * * * *